United States Patent
Iwasa

(10) Patent No.: US 10,561,043 B2
(45) Date of Patent: Feb. 11, 2020

(54) AIR CONDITIONING CONTROL DEVICE AND AIR CONDITIONING CONTROL METHOD

(71) Applicant: FUJITSU LIMITED, Kawasaki-shi, Kanagawa (JP)

(72) Inventor: Kazunori Iwasa, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 115 days.

(21) Appl. No.: 15/820,038

(22) Filed: Nov. 21, 2017

(65) Prior Publication Data

US 2018/0168072 A1 Jun. 14, 2018

(30) Foreign Application Priority Data

Dec. 9, 2016 (JP) .................. 2016-239264

(51) Int. Cl.
*G05B 13/02* (2006.01)
*H05K 7/20* (2006.01)
*F24F 11/64* (2018.01)
*F24F 11/65* (2018.01)
*F24F 11/38* (2018.01)
*F24F 11/49* (2018.01)
*F24F 110/10* (2018.01)
*F24F 140/60* (2018.01)
*F24F 11/30* (2018.01)

(52) U.S. Cl.
CPC .......... *H05K 7/20745* (2013.01); *F24F 11/38* (2018.01); *F24F 11/49* (2018.01); *F24F 11/64* (2018.01); *F24F 11/65* (2018.01); *G05B 13/021* (2013.01); *G05B 13/0265* (2013.01); *H05K 7/20836* (2013.01); *F24F 11/30* (2018.01); *F24F 2110/10* (2018.01); *F24F 2140/60* (2018.01); *G05B 2219/2614* (2013.01)

(58) Field of Classification Search
CPC combination set(s) only.
See application file for complete search history.

(56) References Cited

U.S. PATENT DOCUMENTS

| | | | |
|---|---|---|---|
| 2012/0117995 A1* | 5/2012 | Moore | F25B 49/022 62/157 |
| 2016/0295750 A1* | 10/2016 | Zhang | H05K 7/20836 |
| 2018/0003762 A1* | 1/2018 | Burlak | G01R 31/2635 |

FOREIGN PATENT DOCUMENTS

JP    2016-8745    1/2016

* cited by examiner

*Primary Examiner* — Mohammad Ali
*Assistant Examiner* — Sheela Rao
(74) *Attorney, Agent, or Firm* — Fujitsu Patent Center

(57) ABSTRACT

An air conditioning control device includes, a memory and, a processor configured to, calculate a first setting for air conditioning control at which electric power consumed by the air conditioning control is lowest, calculate a second setting for air conditioning control at which a failure rate of a device which is installed in a target place for the air conditioning control is lowest, compare a first value calculated based on first electric power and a first failure rate when air conditioning control is performed on the basis of the first setting with a second value calculated based on second electric power and a second failure rate when air conditioning control is performed on the basis of the second setting, and determine a specific setting for air conditioning control in accordance with a result of comparison of the first value and the second value.

17 Claims, 10 Drawing Sheets

FIG. 3

| YEAR/MONTH/DATE | DETECTION TIME | OUTSIDE AIR TEMPERATURE | INTAKE AIR TEMPERATURE | HUMIDITY | ELECTRIC POWER CONSUMPTION | ... |
|---|---|---|---|---|---|---|
| 2016/9/7 | 0:00 | 24.0°C | 23.0°C | | | ... |
| 2016/9/7 | 0:01 | 24.0°C | 22.8°C | | | ... |
| 2016/9/7 | 0:02 | 24.1°C | 23.0°C | | | ... |
| 2016/9/7 | 0:03 | 24.0°C | 23.1°C | | | ... |
| ... | | | | | | |

FIG. 7

| YEAR/MONTH/DATE | TIME | PRIORITY CLASSIFICATION | SETTING TEMPERATURE | FAILURE RATE | FAILURE COST | ELECTRIC POWER COST | TOTAL COST |
|---|---|---|---|---|---|---|---|
| 2016/9/7 | 0:00 TO 1:00 | POWER COST PRIORITY | 25.0°C | 5% | 2.5 MILLION YEN | 1.1 MILLION YEN | 3.6 MILLION YEN |
| | | FAILURE COST PRIORITY | 23.0°C | 3% | 1.5 MILLION YEN | 2 MILLION YEN | 3.5 MILLION YEN |
| 2016/9/7 | 1:00 TO 2:00 | POWER COST PRIORITY | 25.0°C | 5% | 2.5 MILLION YEN | 1.1 MILLION YEN | 3.6 MILLION YEN |
| | | FAILURE COST PRIORITY | 23.5°C | 4% | 2 MILLION YEN | 1.9 MILLION YEN | 3.9 MILLION YEN |
| 2016/9/7 | 2:00 TO 3:00 | POWER COST PRIORITY | 25.5°C | 6% | 3 MILLION YEN | 0.9 MILLION YEN | 3.9 MILLION YEN |
| | | FAILURE COST PRIORITY | 23.2°C | 3% | 1.5 MILLION YEN | 1.95 MILLION YEN | 3.45 MILLION YEN |
| 2016/9/7 | 3:00 TO 4:00 | POWER COST PRIORITY | 25.5°C | 6% | 3 MILLION YEN | 0.9 MILLION YEN | 3.9 MILLION YEN |
| | | FAILURE COST PRIORITY | 23.3°C | 3% | 1.5 MILLION YEN | 1.93 MILLION YEN | 343 MILLION YEN |
| ... | | | | | | | |

FIG. 8

| YEAR/MONTH/DATE | TIME | SETTING TEMPERATURE | FAILURE RATE |
|---|---|---|---|
| 2016/9/7 | 0:00 TO 1:00 | 23.0°C | 3% |
| 2016/9/7 | 1:00 TO 2:00 | 25.0°C | 5% |
| 2016/9/7 | 2:00 TO 3:00 | 23.2°C | 3% |
| 2016/9/7 | 3:00 TO 4:00 | 23.3°C | 3% |

AIR CONDITIONING CONTROL DEVICE AND AIR CONDITIONING CONTROL METHOD

CROSS-REFERENCE TO RELATED APPLICATION

This application is based upon and claims the benefit of priority of the prior Japanese Patent Application No. 2016-239264, filed on Dec. 9, 2016, the entire contents of which are incorporated herein by reference.

FIELD

The embodiment discussed herein is related to an air conditioning control device and an air conditioning control method.

BACKGROUND

In a data center in which a large number of IT devices, such as servers or the like, are installed, an air conditioning device that processes heat generated from the IT devices is used and a large amount of electric power is consumed. Therefore, in both terms of environment and operation cost of the data center, electric power reduction is a key challenge. In this challenge, electric power that is consumed by an air conditioning system, such as a cooling unit or the like, is electric power indirectly used for operation of the data center, and how the electric power that is consumed by the air conditioning system is reduced is one of challenges of a data center operator.

As measures for reduction in electric power consumption in the air conditioning system in the data center, various attempts are being made. For example, a system that measures electric power consumption of a load and includes a past electric power consumption database in which the electric power consumption of the load for dates and times in past is collected has been proposed. This system determines, when the electric power consumption of the load, which has been measured, changes, whether or not the change in the electric power consumption is to continue by comparing the latest electric power consumption to electric power consumption of corresponding date and time in the past electric power consumption database or date and time near the corresponding date and time. Then, the system controls, if it has been determined that the change in the electric power consumption is to continue, air conditioning capacity of an air conditioner in accordance with the change in electric power consumption of the load.

As an approach to reduction in electric power consumption in an air conditioning system in a data center, there is an approach in which electric power consumption for cooling is reduced by increasing room temperature in the data center in a proper range.

For example, a related art is disclosed in Japanese Laid-open Patent Publication No. 2016-8745.

SUMMARY

According to an aspect of the invention, an air conditioning control device includes, a memory and, a processor configured to, calculate a first setting for air conditioning control at which electric power consumed by the air conditioning control is lowest, calculate a second setting for air conditioning control at which a failure rate of a device which is installed in a target place for the air conditioning control is lowest, compare a first value calculated based on first electric power and a first failure rate when air conditioning control is performed on the basis of the first setting with a second value calculated based on second electric power and a second failure rate when air conditioning control is performed on the basis of the second setting, and determine a specific setting for air conditioning control in accordance with a result of comparison of the first value and the second value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a table illustrating an example of a sensor data database;

FIG. 7 is a table illustrating an example of a cost comparison table;

FIG. 8 is a table illustrating an example of setting history database;

DESCRIPTION OF EMBODIMENT

In related art, in accordance with the Arrhenius law that a lifetime becomes half for every 10° C. increase in environment temperature, for a component, such as a capacitor or the like, which is used in an IT device, such as a server or the like, merely increasing room temperature in the data center leads reduction in lifetime of the IT device. That is, a problem arises in which, by increasing room temperature in the data center, electric power consumption for air conditioning may be reduced on one hand but the lifetime of an IT device is reduced on the other hand, so that costs for repair, replacement, or the like of IT devices are increased.

In an aspect, according to an embodiment, in air conditioning control in a device installation place, a setting value with which cost reduction in consideration of a failure of a device may be achieved may be calculated.

An example of an embodiment of a technology disclosed herein will be described in detail below with reference to the accompanying drawings.

Figure 1:
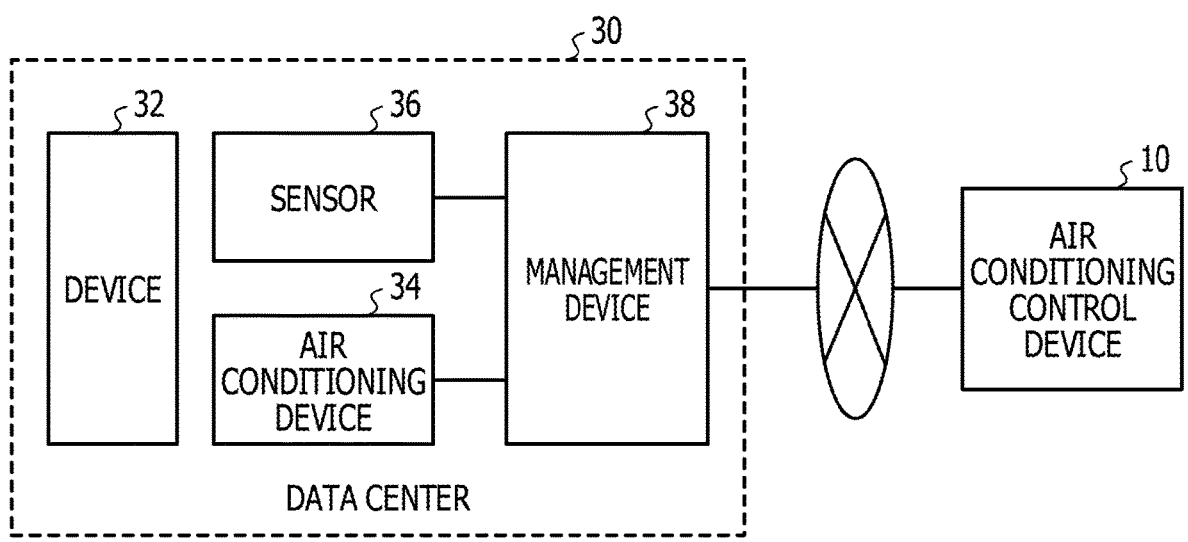
FIG. 1 is a block diagram illustrating a schematic configuration of an air conditioning control device and a data center.

As illustrated in FIG. 1, an air conditioning control device 10 according to this embodiment is coupled to a management device 38 of a data center 30 via a network.

In the data center 30, a plurality of IT devices (which will be hereinafter merely referred to as "devices") 32, such as servers or the like, an air conditioning device 34, a sensor 36, and the management device 38 are installed. Note that, although, in FIG. 1, a single device 32, a single air conditioning device 34, and a single sensor 36 are illustrated, multiple ones of each of those components are arranged in the data center 30.

The air conditioning device 34 performs cooling, ventilation, or the like, based on a setting value that has been set by the management device 38 in order to reduce increase in temperature in the data center 30 and of the devices 32 themselves due to heat generation that occurs along with operation of the devices 32. As the setting value, for example, on or off of each air conditioning device 34, a setting temperature, a wind volume, a wind direction, or the like is used. In this embodiment, for simplification of description, among the setting values, setting of a setting temperature will be described.

The sensors 36 detect information related to environments inside and outside of the data center 30 and include, for example, a thermometer, a hygrometer, a barometer, an electric power consumption meter, or the like. Each of the sensors 36 detects information of, for example, a room temperature of the data center 30, an outside air temperature, an intake air temperature of the devices 32, a room humidity, or the like in predetermined time intervals (for example, in one-minute intervals) and outputs a detected detection value to the management device 38.

The management device 38 may be realized by an information processing device, such as a server device, a personal computer, or the like. The management device 38 adds, to a detection value that has been acquired from each of the sensors 36, information of a detection time, the type of the sensor 36, or the like to achieve sensor data of a predetermined format and transmits the sensor data to the air conditioning control device 10. The management device 38 may be configured to transmit the sensor data to the air conditioning control device 10 each time the management device 38 acquires a detection value from each of the sensors 36, and also may be configured to hold the sensor data for a predetermined time (for example, for one hour) and transmit the sensor data that has been held for the predetermined time together to the air conditioning control device 10 at every predetermined time. Also, the management device 38 receives a setting value of each of the air conditioning devices 34, which is transmitted from the air conditioning control device 10, and sets the setting value that has been received in each of the air conditioning devices 34.

Figure 2:
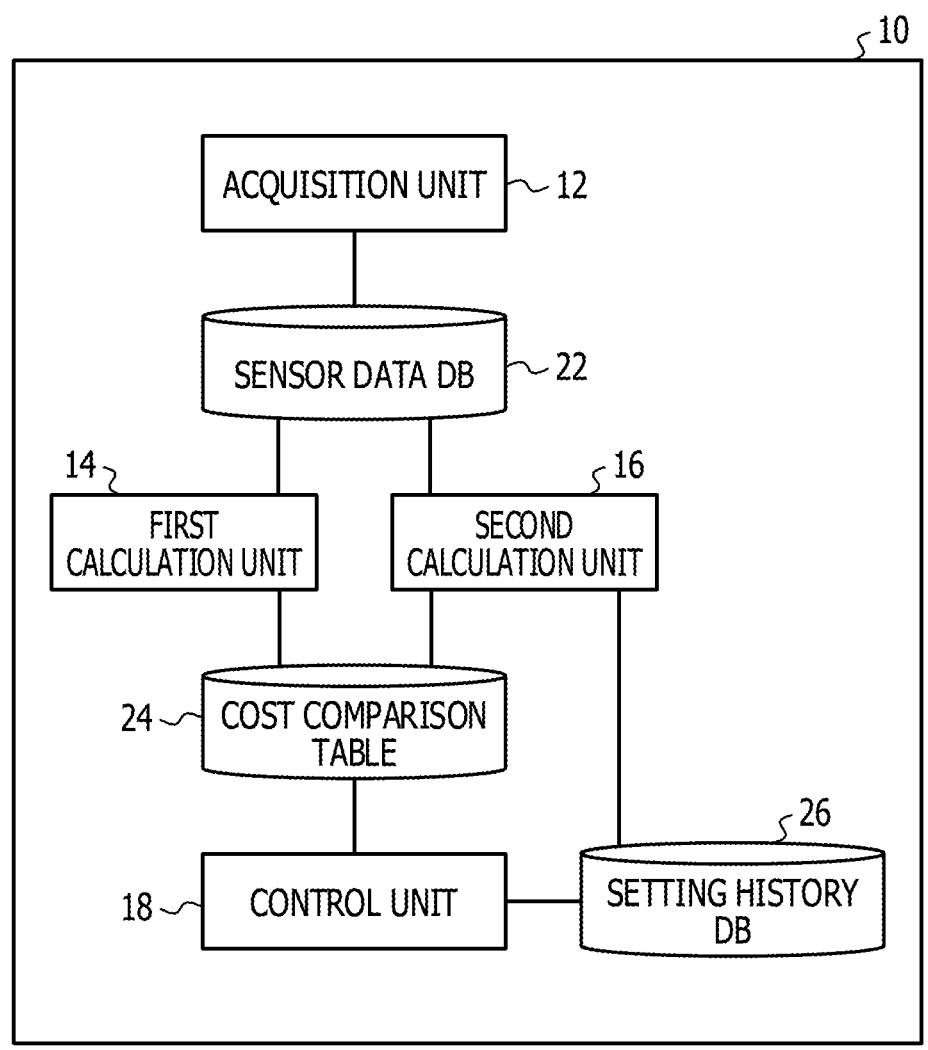
FIG. 2 is a functional block diagram of an air conditioning control device.

As illustrated in FIG. 2, the air conditioning control device 10 functionally includes an acquisition unit 12, a first calculation unit 14, a second calculation unit 16, and a control unit 18. Also, in a predetermined storage area of the air conditioning control device 10, a sensor data database (DB) 22, a cost comparison table 24, and a setting history DB 26 are stored.

The acquisition unit 12 acquires sensor data that has been transmitted from the management device 38 of the data center 30 and stores the sensor data, for example, in the sensor data database DB 22 illustrated in FIG. 3. In the sensor data database DB 22 illustrated in FIG. 3, an example in which each sensor data is stored in association with an item that indicates detection contents that correspond to the type of the sensor 36 is illustrated. For example, when, as the type of the sensor 36, information that indicates that the sensor 36 is a thermometer installed outside the data center 30 is given to sensor data, the acquisition unit 12 stores a value of the sensor data in association with an item of "OUTSIDE AIR TEMPERATURE".

Figure 4:
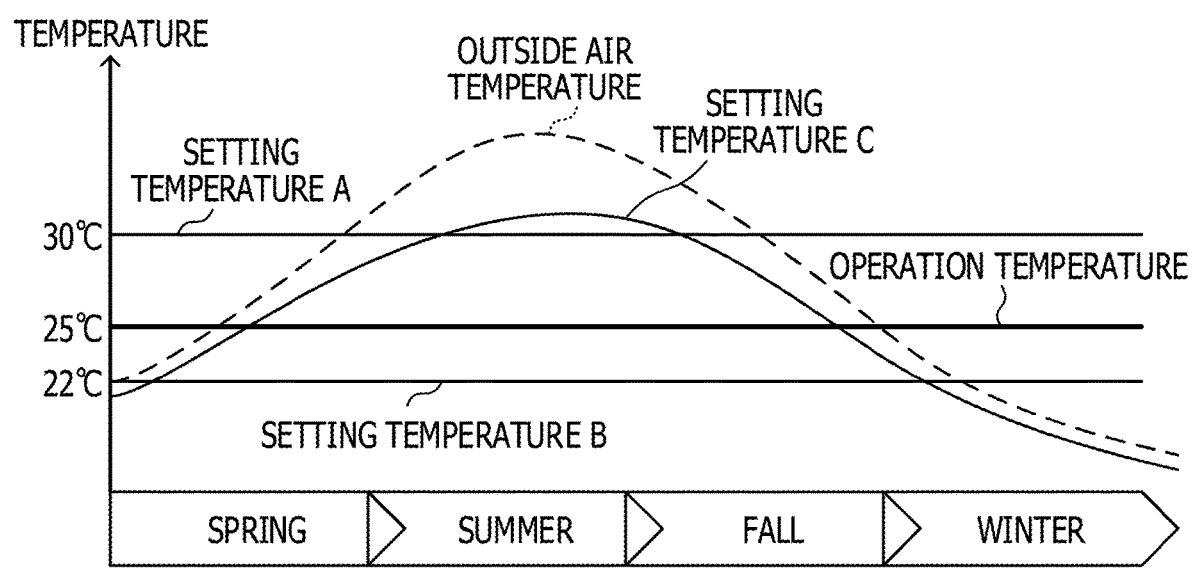
FIG. 4 is a graph illustrating a precondition for setting temperature.

In this case, in air conditioning control of the data center 30, in order to reduce electric power consumption for electric power that is consumed in the air conditioning device 34, as indicated by SETTING TEMPERATURE A in FIG. 4, setting a setting temperature of the air conditioning device 34 relatively high is an option. However, when the setting temperature is set relatively high, in accordance with the Arrhenius law that the lifetime of the device 32 becomes half for every 10° C. increase in environment temperature, a risk of device failure increases. Therefore, as indicated by SETTING TEMPERATURE B in FIG. 4, reducing the setting temperature to a temperature at which a high failure reduction effect is achieved is an option. In this case, in a season, that is, especially in summer, in which an outside air temperature is high, a difference between the outside air temperature and the setting temperature is large, and therefore, the electric power consumption of the air conditioning device 34 increases.

Therefore, in this embodiment, as a precondition, as indicated by SETTING TEMPERATURE C in FIG. 4, a setting temperature at which an average of setting temperatures in a predetermined period (for example, one year) is an operation temperature that has been determined in advance and the difference between the setting temperature and the outside air temperature throughout the predetermined period is as small as possible is set. Therefore, the first calculation unit 14 calculates a setting temperature with a priority on reduction in electric power consumption and the second calculation unit 16 calculates a setting temperature with a priority on reduction in failure rate. Then, a setting temperature at which a higher cost reduction effect is achieved is determined by the control unit 18. Each of the first calculation unit 14, the second calculation unit 16, and the control unit 18 will be described below in detail.

The first calculation unit 14 acquires most recent sensor data for a predetermined time (for example, one hour) from the sensor data database DB 22 and calculates an average of detection values for the predetermined time for each item (for example, "OUTSIDE AIR TEMPERATURE", "INTAKE AIR TEMPERATURE", "HUMIDITY", or the like) of sensor data. The first calculation unit 14 calculates a setting temperature at which the electric power consumption of the air conditioning device 34 is the lowest in a current environment of the data center 30, based on the average of detection values of each item, which has been calculated. In order to calculate this setting temperature, for example, the first calculation unit 14 may be realized by an artificial intelligence (AI) engine that receives, as inputs, various types of sensor data and outputs the setting temperature at which the electric power consumption is the lowest. The AI engine may be constructed, for example, by learning learning data obtained by combining various types of sensor data including the electric power consumption and the setting temperature together under the above-described precondition.

The first calculation unit 14 stores the setting temperature at which the electric power consumption is the lowest and an electric power cost that corresponds to the then electric power consumption in the cost comparison table 24 (which will be described later).

Figure 5:
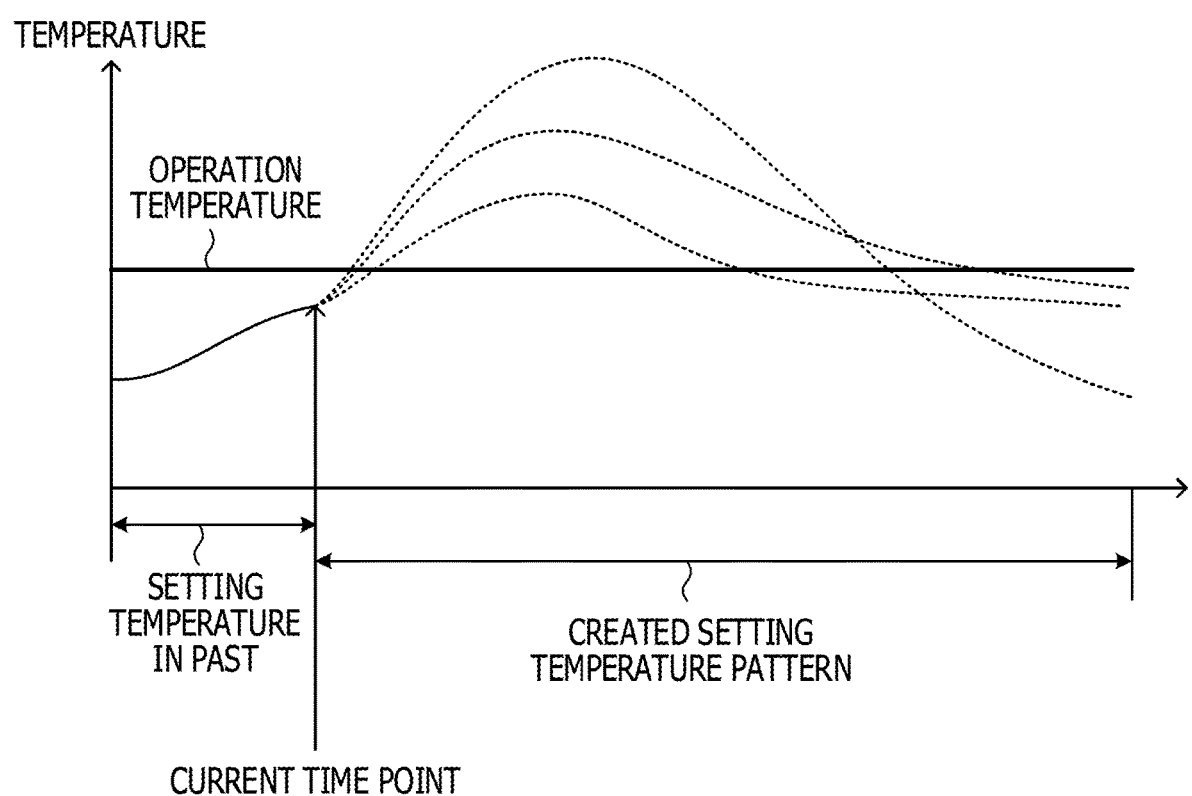
FIG. 5 is a graph illustrating creation of each pattern of setting temperature.

The second calculation unit 16 acquires sensor data of "OUTSIDE AIR TEMPERATURE" for a most recent predetermined period (for example, one hour) from the sensor data database DB 22 and calculates an average of outside air temperatures for the predetermined period. The second calculation unit 16 creates a plurality of patterns of the setting temperature for the predetermined period (for example, one year), based on the above-described precondition and the average of outside air temperatures, which has been calculated. In creating the patterns, as illustrated in FIG. 5, in each pattern that is created, the second calculation unit 16 fixes the setting temperature to a setting temperature that has been set in past for a period that has been already elapsed in the corresponding predetermined period. The second calculation unit 16 acquires the setting temperature that has been set in past from the setting history DB 26, which will be described later.

Specifically, the second calculation unit 16 predicts a future outside air temperature pattern from the average of current outside air temperatures, which has been calculated. For example, among outside air temperature patterns of last several years, an outside air temperature pattern of a year the outside air temperature of which, in the same season as that of the current time, is close to the outside air temperature at the current time may be used as the future outside air temperature pattern. Also, the second calculation unit 16 is able to use as the future outside air temperature pattern an outside air temperature pattern of a precious year as it is, or use a pattern obtained by correcting the outside air temperature pattern of the precious year, based on the current outside air temperature. As illustrated in FIG. 5, the second calculation unit 16 changes a temperature from an outside air temperature at random in each point (for example, each point at every one hour) in a predicted outside air temperature pattern to create a plurality of setting temperature patterns. Note that, in order to realize the above-described precondition, the second calculation unit 16 creates each pattern such that an average in the entire setting temperature pattern (including a part of a setting temperature that has been set in past) in each point is an operation temperature that has been set in advance.

The second calculation unit 16 calculates the failure rate of the device 32 when air conditioning control is performed at the setting temperature of each point for each of the patterns that have been created. The failure rate is a prediction value that indicates how many devices out of hundred devices 32 malfunction when air conditioning control is performed at the setting temperature for a predetermined period (for example, one year). For example, the second calculation unit 16 is able to calculate the failure rate in accordance with the Arrhenius law using Expression 1 below.

Failure rate=100−exp(−kt)

Arrhenius's formula: $k = A \exp(-E/RT)$ (1)

However, in the Arrhenius's formula, A is a frequency factor, E is active energy, R is a gas constant, and T is a temperature. In this embodiment, A is a fixed value which has been defined in advance, E is a fixed value (a value of 0.3 to 1.4 eV, that is, for example, 1.0 eV) which has been defined in advance in accordance with the type of the corresponding device 32, R is a fixed value (8.3144621 $JK^{-1}mol^{-1}$), and T is a setting temperature. Also, t in Expression 1 is the number of days (for example, 365 days) that have been passed at an end of an entire period of a setting temperature pattern that has been created.

Note that, in this embodiment, in order to calculate a cost based on the lifetime of the device 32, the above-described failure rate is used.

Figure 6:
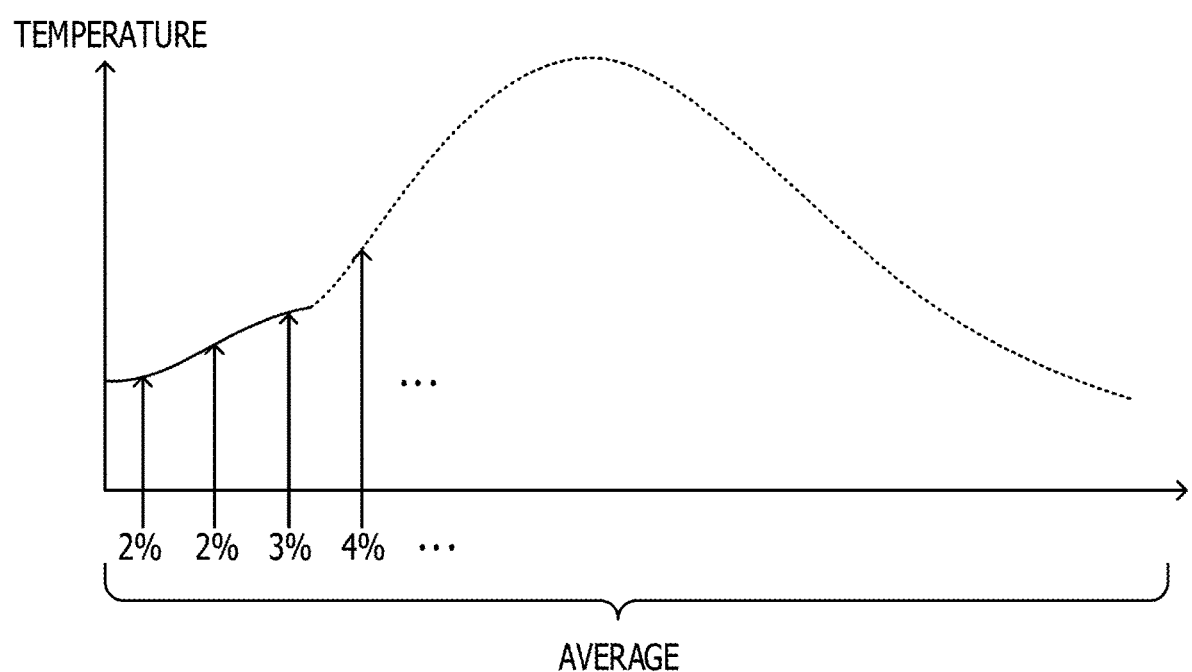
FIG. 6 is a graph illustrating calculation of failure rate of each pattern.

The second calculation unit 16 calculates, as illustrated in FIG. 6, a value obtained by averaging the failure rate which has been calculated at each point throughout the entire period for each pattern as the failure rate of each pattern.

Also, the second calculation unit 16 calculates, for each pattern, an expense (which will be hereinafter referred to as a "failure cost") for repair, replacement, or the like for failure of the device 32 when air conditioning control has been performed in the setting temperature pattern. For example, the second calculation unit 16 calculates the failure cost by multiplying the amount of assets of all of the devices 32 in the data center 30 by the calculated failure rate. The second calculation unit 16 selects a pattern with which the calculated failure cost is the lowest and acquires a setting temperature that corresponds to the corresponding time from the pattern. The second calculation unit 16 stores the setting temperature at which the failure cost is the lowest and the then failure cost in the cost comparison table 24.

The cost comparison table 24 is a table that is used for comparing a total cost based on the setting temperature that has been calculated by the first calculation unit 14 and a total cost based on the setting value that has been calculated by the second calculation unit 16 to one another. A total cost is the total of an electric power cost and a failure cost when air conditioning control is performed at a certain setting temperature. In the following description, a case in which a total cost is calculated based on the setting temperature that has been calculated by the first calculation unit 14 is also referred to as "power cost priority" and a case in which a total cost is calculated based on the setting temperature that has been calculated by the second calculation unit 16 is also referred to as "failure cost priority".

In FIG. 7, an example of the cost comparison table 24 is illustrated. In the example of FIG. 7, the cost comparison table 24 includes items of "YEAR/MONTH/DATE", "TIME", "PRIORITY CLASSIFICATION", "SETTING TEMPERATURE", "FAILURE RATE", "FAILURE COST", "ELECTRIC POWER COST", and "TOTAL COST". "YEAR/MONTH/DATE" and "TIME" are a date and a time slot that specify a time unit in which a setting temperature is calculated. "PRIORITY CLASSIFICATION" is a classification of whether a priority is put on the electric power cost or the failure cost. "SETTING TEMPERATURE" is a setting temperature that has been calculated by the first calculation unit 14 in a case of power cost priority and is a setting temperature that has been calculated by the second calculation unit 16 in a case of failure cost priority. In the case of power cost priority, "FAILURE RATE" and "FAILURE COST" are a failure rate and a failure cost which have been calculated by the control unit 18, which will be described later and, in the case of failure cost priority, "FAILURE RATE" and "FAILURE COST" are a failure rate and a failure cost which have been calculated by the second calculation unit 16. In the case of power cost priority, "ELECTRIC POWER COST" is an electric power cost which has been calculated by the first calculation unit 14 and, in the case of failure cost priority, "ELECTRIC POWER COST" is a failure cost which has been calculated by the control unit 18, which will be described later. "TOTAL COST" is a total of "FAILURE COST" and "ELECTRIC POWER COST".

The control unit 18 refers to the cost comparison table 24 and calculates the total cost in each of the case of power cost priority and the case of failure cost priority.

Specifically, when the total cost in power cost priority is calculated, the control unit 18 calculates the failure rate when air conditioning control has been performed at "SETTING TEMPERATURE" stored in the cost comparison table 24, that is, the setting temperature that has been calculated by the first calculation unit 14, in accordance with Expression 1 above. Also, the control unit 18 calculates the failure cost by multiplying the amount of assets of all of the devices 32 by the failure rate in a similar manner to that in the description of the second calculation unit 16. The control unit 18 stores the failure rate and the failure cost which have been calculated in the cost comparison table 24.

Also, when the total cost in failure cost priority is calculated, the control unit 18 calculates the electric power cost when air conditioning control is performed at "SETTING TEMPERATURE" stored in the cost comparison table 24, that is, the setting temperature that has been calculated by the second calculation unit 16. In order to calculate the electric power cost, the control unit 18 may be configured to include, for example, an AI engine that receives a setting temperature as an input and outputs an electric power cost in accordance with electric power consumption when air conditioning control is performed at the setting temperature. The AI engine may be constructed, for example, by learning leaning data obtained by combining a setting cost and an electric power cost together. The control unit 18 stores the calculated electric power cost in the cost comparison table 24.

Also, in either of both cases of power cost priority and failure cost priority, the control unit 18 sums up "FAILURE COST" and "ELECTRIC POWER COST", which are stored in the cost comparison table 24, to calculate the total cost and stores the total cost in the cost comparison table 24.

The control unit 18 compares the total cost in the case of power cost priority and the total cost in the case of failure cost priority to one another and determines, as the setting temperature that is to be set in the air conditioning device 34, the setting temperature at which the total cost is lower. The control unit 18 transmits the determined setting temperature to the management device 38 of the data center 30. Also, the control unit 18 stores the time unit ("YEAR/MONTH/DATE" and "TIME") in which the setting temperature has been calculated, the determined setting temperature, and the failure rate that corresponds to the setting temperature, for example, in the setting history DB 26 illustrated in FIG. 8. Information stored in the setting history DB 26 is used when patterns of the setting temperature are created by the second calculation unit 16 as described above.

Figure 9:
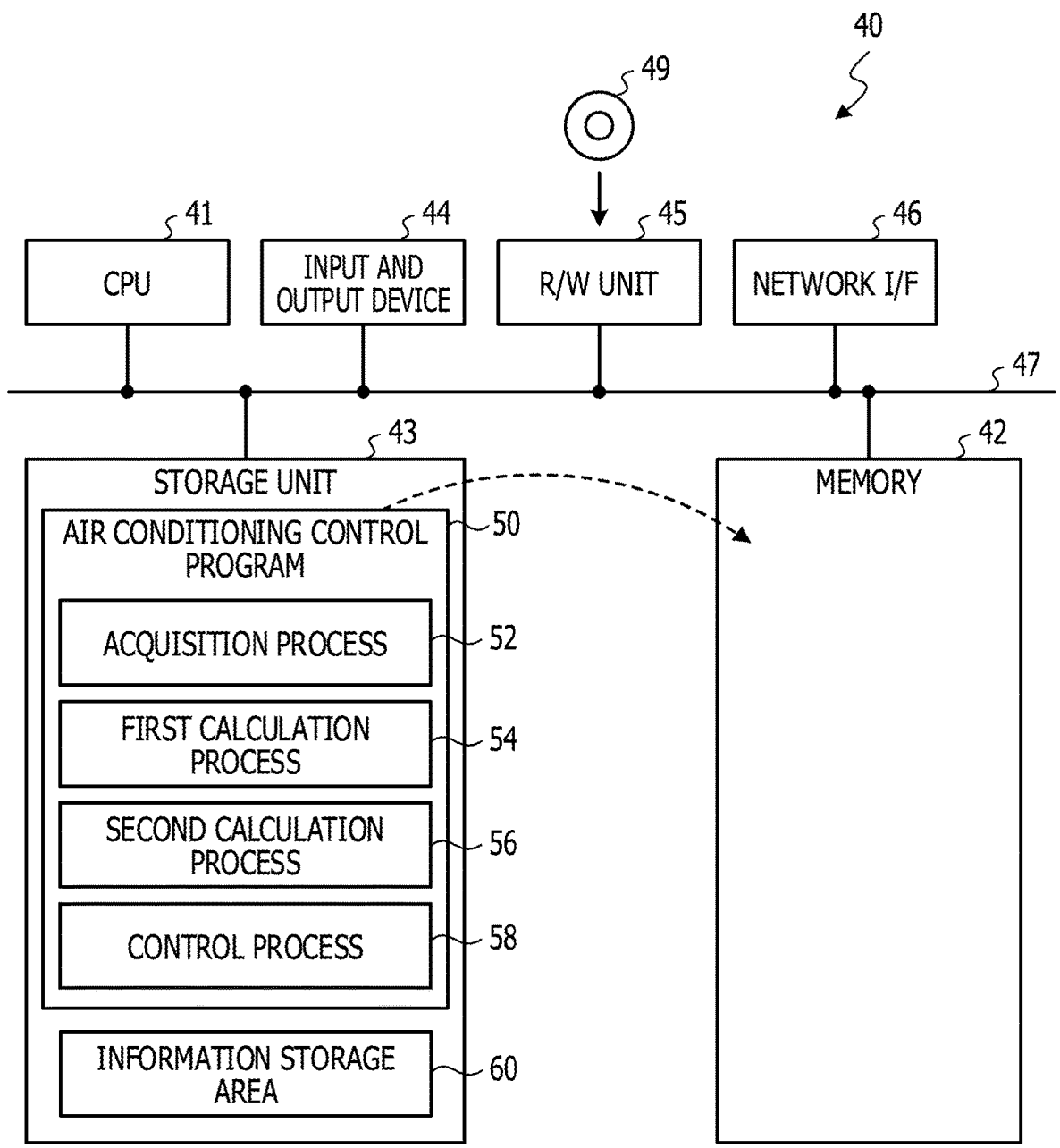
FIG. 9 is a block diagram illustrating a schematic configuration of a computer that functions as an air conditioning control device.

The air conditioning control device 10 may be realized, for example, by a computer 40 illustrated in FIG. 9. The computer 40 includes a central processing unit (CPU) 41, a memory 42 as a temporary storage area, and a nonvolatile storage unit 43. Also, the computer 40 includes an input and output device 44, a read/write (R/W) unit 45 that controls read and write data from and to a storage medium 49, and a communication interface (I/F) 46 that is coupled to a network, such as the Internet or the like. The CPU 41, the memory 42, the storage unit 43, the input and output device 44, the R/W unit 45, and the communication I/F 46 are coupled to one another via a bus 47.

The storage unit 43 may be realized by a hard disk driver (HDD), a solid state drive (SSD), a flash memory, or the like. In the storage unit 43 as a storage medium, an air conditioning control program 50 that causes the computer 40 to function as the air conditioning control device 10 is stored. The air conditioning control program 50 includes an acquisition process 52, a first calculation process 54, a second calculation process 56, and a control process 58. Also, the storage unit 43 includes an information storage area 60 in which information that forms each of the sensor data database DB 22, the cost comparison table 24, and the setting history DB 26 is stored.

The CPU 41 reads the air conditioning control program 50 from the storage unit 43, expands the air conditioning control program 50 in the memory 42, and sequentially executes the processes of the air conditioning control program 50. The CPU 41 executes the acquisition process 52 and thereby operates as the acquisition unit 12 illustrated in FIG. 2. Also, the CPU 41 executes the first calculation process 54 and thereby operates as the first calculation unit 14 illustrated in FIG. 2. Also, the CPU 41 executes the second calculation process 56 and thereby operates as the second calculation unit 16 illustrated in FIG. 2. Also, the CPU 41 executes the control process 58 and thereby operates as the control unit 18 illustrated in FIG. 2. Also, the CPU 41 reads information from the information storage area 60 and expands each of the sensor data database DB 22, the cost comparison table 24, and the setting history DB 26 in the memory 42. Thus, the computer 40 that has executed the air conditioning control program 50 functions as the air conditioning control device 10. Note that the CPU 41 that executes the program is hardware.

Note that functions that are realized by the air conditioning control program 50 may be also realized, for example, by a semiconductor integrated circuit, more specifically, an application specific integrated circuit (ASIC) or the like.

Next, an operation of the air conditioning control device 10 according to this embodiment will be described. Note that a case in which an operation is performed such that the setting temperature for one year is the above-described precondition will be described below.

Figure 10:
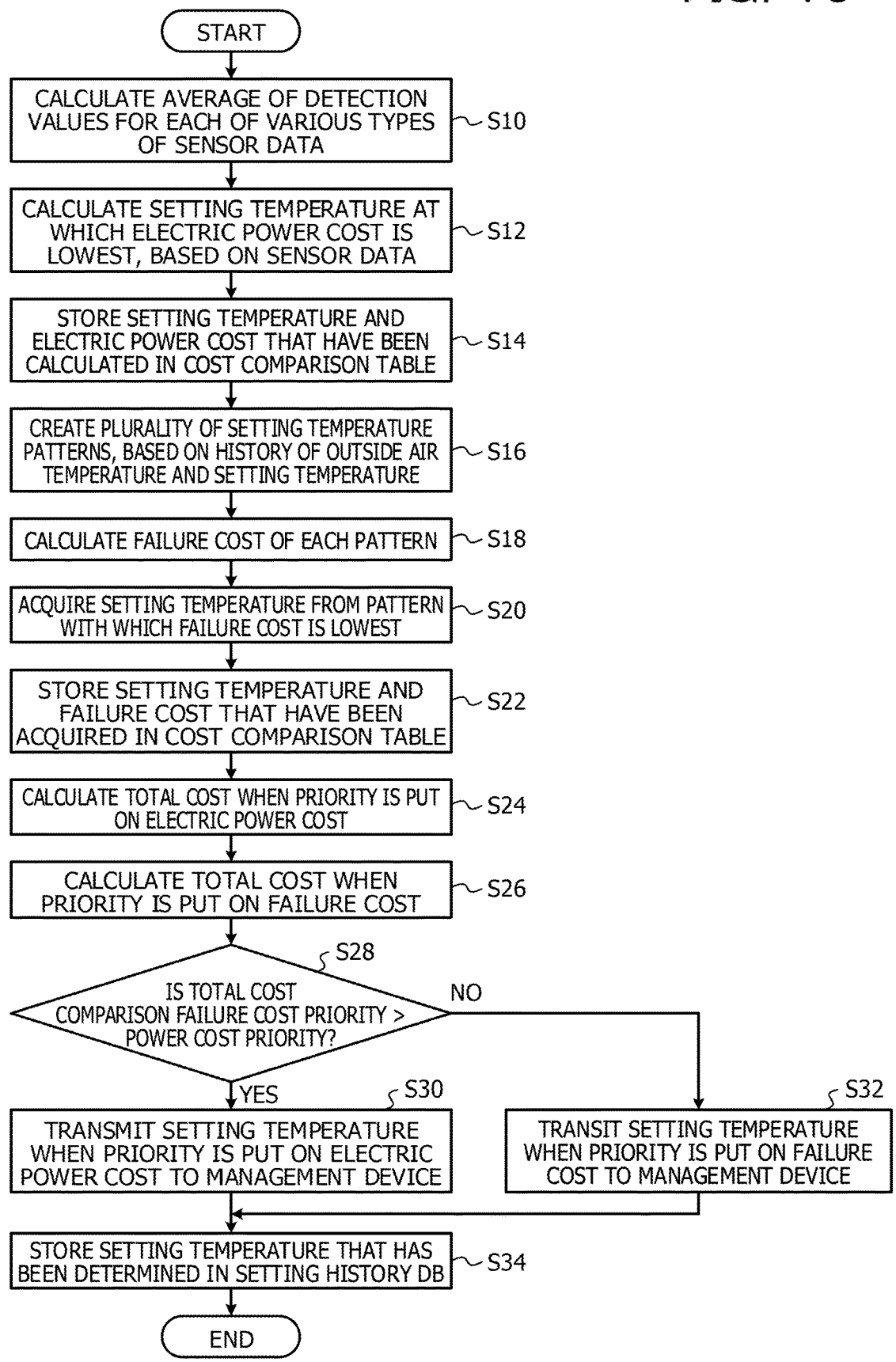
FIG. 10 is a flowchart illustrating an example of air conditioning control processing in an embodiment.

At a predetermined timing, that is, for example, in one-minute intervals, the acquisition unit 12 acquires sensor data that is transmitted from the management device 38 of the data center 30 and stores the acquired sensor data, for example, in the sensor data database DB 22 illustrated in FIG. 3. Then, air conditioning control processing illustrated in FIG. 10 is executed at every predetermined time in the air conditioning control device 10. A case in which air conditioning control processing is executed every hour will be described below. Note that air conditioning control processing is an example of an air conditioning control method according to a technology disclosed herein.

In Step S10, the first calculation unit 14 acquires sensor data for most recent one hour from the sensor data database DB 22 and calculates an average of detection values for one hour for each of items of the sensor data.

Next, in Step S12, the first calculation unit 14 calculates a setting temperature at which the electric power cost is the lowest in a current environment of the data center 30, based on the average of the detection values for each of the items, which has been calculated.

Next, in Step S14, the first calculation unit 14 retrieves or adds, in the cost comparison table 24, a row in which "YEAR/MONTH/DATE" and "TIME" correspond to a detection time of the sensor data that has been acquired in Step S10 described above and also in which "PRIORITY CLASSIFICATION" is "POWER COST PRIORITY". Then, the first calculation unit 14 stores the calculated setting temperature and the then electric power cost in the retrieved or added row.

Next, in Step S16, the second calculation unit 16 acquires the sensor data of "OUTSIDE AIR TEMPERATURE" for most recent one hour from the sensor data database DB 22 and calculates an average of the outside air temperatures for the predetermined time. Note that, for the average of the outside air temperatures, a value calculated by the first calculation unit 14 in Step S10 described above may be used. Then, the second calculation unit 16 creates a plurality of patterns of the setting temperature for one year, based on the average of the outside air temperatures, which has been calculated, and the setting temperatures stored in the setting history DB 26, under a restriction of the above-described precondition.

Next, in Step S18, the second calculation unit 16 calculates the failure rate at each point in each of the created patterns, for example, in accordance with Expression 1, averages the failure rates for the entire period, and calculates the failure rate of each pattern. Then, the second calculation unit 16 calculates the failure cost for each pattern using the calculated failure rate.

Next, in Step S20, the second calculation unit 16 selects a pattern with which the calculated failure cost is the lowest and acquires the setting temperature from the pattern.

Next, in Step S22, the second calculation unit 16 retrieves or adds, in the cost comparison table 24, a row in which "YEAR/MONTH/DATE" and "TIME" correspond to the detection time of the sensor data that has been acquired in Step S10 described above and also in which "PRIORITY CLASSIFICATION" is "FAILURE COST PRIORITY". Then, the second calculation unit 16 stores the setting temperature at which the failure cost is the lowest and the then failure cost in the retrieved or added row in the cost comparison table 24.

Next, in Step S24, the control unit 18 calculates the failure rate when air conditioning control has been performed at "SETTING TEMPERATURE" of the row in which "YEAR/MONTH/DATE" and "TIME" are corresponding ones and "PRIORITY CLASSIFICATION" is "POWER COST PRIORITY" in the cost comparison table 24 in accordance with Expression 1 described above. Then, the control unit 18 calculates the failure cost that corresponds to the calculated failure rate and stores the failure rate and the failure cost which have been calculated in the corresponding row in the cost comparison table 24. Furthermore, the control unit 18 sums up the "FAILURE COST" and "ELECTRIC POWER COST" stored in the cost comparison table 24 to calculate the total cost and stores the total cost in the corresponding row in the cost comparison table 24.

Next, in Step S26, the control unit 18 calculates the electric power cost when air conditioning control has been performed at "SETTING TEMPERATURE" of the row in which "YEAR/MONTH/DATE" and "TIME" are corresponding ones and "PRIORITY CLASSIFICATION" is "FAILURE COST PRIORITY" in the cost comparison table 24. Then, the control unit 18 stores the calculated electric power cost in the corresponding row of the cost comparison table 24. Furthermore, the control unit 18 sums up "FAILURE COST" and "ELECTRIC POWER COST" stored in the cost comparison table 24 to calculate the total cost and stores the total cost in the corresponding row in the cost comparison table 24.

Next, in Step S28, the control unit 18 determines whether or not the total cost in a case of failure cost priority is higher than the total cost in a case of power cost priority. If a result of the determination is affirmative, the process proceeds to Step S30 and, if the result of the determination is negative, the process proceeds to Step S32.

In Step S30, the control unit 18 determines the setting temperature in the case of power cost priority as the setting temperature that is to be set in the air conditioning device 34 and transmits the setting temperature to the management device 38. On the other hand, in Step S32, the control unit 18 determines the setting temperature in the case of failure cost priority as the setting temperature that is to be set in the air conditioning device 34 and transmits the setting temperature to the management device 38.

Next, in Step S34, the control unit 18 stores the time unit ("YEAR/MONTH/DATE" and "TIME") in which the setting temperature has been calculated, the determined setting temperature, and the failure rate that corresponds to the setting temperature, for example, in the setting history DB 26 illustrated in FIG. 8 and the air conditioning control processing is terminated.

As has been described above, in an air conditioning control device according to this embodiment, a cost when electric power consumption is minimized and a cost when the failure rate of a device is minimized are calculated and then are compared to one another to determine a setting value with which the cost is lower as the setting value that is to be set. Thus, in air conditioning control in a device installation place, the setting value with which cost reduction in consideration of a failure of the device may be achieved may be calculated.

Note that, although, in the above-described embodiment, a case in which the setting temperature is calculated as a setting value for an air conditioning device has been described, similarly, a setting value for a wind volume, a wind direction, or the like may be calculated. In this case, the electric power cost may be calculated, for example, using an AI engine which receives sensor data of various types as an input and outputs a combination of setting values for the setting temperature, the wind volume, the wind direction, or the like, with which the electric power consumption is the lowest. Also, when calculating the total cost in failure cost priority, the electric power cost in consideration of the setting values for the wind volume, the wind direction, or the like may be also calculated at the time of calculation of the electric power cost that is to be added to the total cost.

Also, although, in the above-described embodiment, a case in which the Arrhenius law is used for calculating the failure rate has been described, a calculation of the failure rate is not limited thereto. For example, using an AI engine that has learned a combination of the setting value, such as the setting temperature or the like, and the failure rate as learning data, the failure rate that corresponds to the setting value, such as the setting temperature or the like, may be calculated.

Also, although, in the above-described embodiment, a case in which a single setting value is calculated in the entire data center has been described, the number of setting values is not limited thereto. For each of air conditioning devices, a setting value for each air conditioning device may be calculated by executing the above-described air conditioning control processing.

Also, although, in the above-described embodiment, a case in which the setting value is determined to be one of the setting temperature in power cost priority and the setting temperature in failure cost priority has been described, the setting value is not limited thereto. For example, for each of a plurality of setting values between the setting value in power cost priority and the setting value in failure cost priority, the total cost may be calculated by a similar method to that of the above-described embodiment to determine a setting value with which the total cost is the lowest.

Also, in the above-described embodiment, when calculating the electric power cost, the electric power cost in consideration of not only electric power that is consumed in the air conditioning device but also electric power that is consumed in a device may be calculated.

Also, an aspect in which the air conditioning control program 50 is stored (installed) in the storage unit 43 in advance has been described above, but the present disclosure is not limited thereto. The program may be provided in a form in which the program is stored in a storage medium, such as a CD-ROM, a DVD-ROM, a USB memory, or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An air conditioning control device comprising:
   a memory and;
   a processor coupled to the memory and the processor configured to:
      acquire, for each of sensor data items, a plurality of pieces of sensor data which are detected in a time period;
      calculate an average of the plurality of pieces of sensor data;
      calculate, based on the average of the plurality of pieces of sensor data, a setting temperature for air conditioning control at which electric power cost corresponding to electric power consumed by the air conditioning control is lowest,
      store, in a table, lowest electric power cost and the corresponding setting temperature as a power cost priority item in association with a detection time of the plurality of pieces of sensor data,
      create a plurality of setting temperature patterns based on the average of the plurality of pieces of sensor data for one of the sensor data items and a past setting temperature which is set in past;
      calculate, for each of the plurality of setting temperature patterns, a failure rate of a device which is installed in a target place for the air conditioning control,
      acquire a setting temperature of a setting temperature pattern at which a failure cost corresponding to the failure rate is lowest from among the plurality of setting temperature patterns,
      store, in the table, the lowest failure cost and the corresponding setting temperature as a failure cost priority item in association with the detection time of the plurality of pieces of sensor data,
      calculate a first total cost by adding the lowest electric power cost to a failure cost corresponding to a failure rate when air conditioning control is performed based on the setting temperature corresponding to the lowest electric power cost,
      calculate a second total cost by adding the lowest failure cost to an electric power cost corresponding to electric power when air conditioning control is performed based on the setting temperature corresponding to the lowest failure cost,
      compare the first total cost and the second total cost, and
      determine a new setting temperature for air conditioning control which corresponds to smaller one between the first total cost and the second total cost.

2. The air conditioning control device according to claim 1, wherein the failure rate changes in accordance with the setting temperature.

3. The air conditioning control device according to claim 2, wherein the setting temperature corresponding to the lowest failure cost is calculated based on the setting temperature pattern, among the plurality of setting temperature patterns, in which an average of the failure rates which correspond to the setting temperature pattern is smallest.

4. The air conditioning control device according to claim 2, wherein the failure rate of the device is calculated by substituting a setting temperature for air conditioning control in the Arrhenius's equation.

5. The air conditioning control device according to claim 1, wherein each of the electric power cost and the failure cost is calculated under a condition that a temperature of the target place, which is realized by air conditioning control based on the setting temperature, is set such that an average of the temperatures of the target place in a period is an operation temperature that has been determined in advance and a difference between the temperature of the target place and an outside air temperature throughout the period is no more than a threshold value.

6. The air conditioning control device according to claim 1, wherein the plurality of pieces of sensor data are detected by a sensor that detects information related to a setting environment of the device.

7. The air conditioning control device according to claim 1, the processor further configured to transmit the new setting temperature to a management device of an air conditioner installed in the target place.

8. The air conditioning control device according to claim 1, wherein the management device controls the air conditioner to work in accordance with the new setting temperature.

9. An air conditioning control method executed by a computer, the method comprising:
   acquiring, for each of sensor data items, a plurality of pieces of sensor data which are detected in a time period;
   calculating, by a computer, an average of the plurality of pieces of sensor data;
   calculating, based on the average of the plurality of pieces of sensor data, a setting temperature for air conditioning control at which electric power cost corresponding to electric power that is consumed by the air conditioning control is lowest;
   storing, in a table, lowest electric power cost and the corresponding setting temperature as a power cost priority item in association with a detection time of the plurality of pieces of sensor data;
   creating a plurality of setting temperature patterns based on the average of the plurality of pieces of sensor data for one of the sensor data items and a past setting temperature which is set in past;
   calculating, for each of the plurality of setting temperature patterns, a failure rate of a device which is installed in a target place for the air conditioning control;
   acquiring a setting temperature of a setting temperature pattern at which a failure cost corresponding to the failure rate is lowest from among the plurality of setting temperature patterns;
   storing, in the table, the lowest failure cost and the corresponding setting temperature as a failure cost priority item in association with the detection time of the plurality of pieces of sensor data;

calculating a first total cost by adding the lowest electric power cost to a failure cost corresponding to a failure rate when air conditioning control is performed based on the setting temperature corresponding to the lowest electric power cost;

calculating a second total cost by adding the lowest failure cost to an electric power cost corresponding to electric power when air conditioning control is performed based on the setting temperature corresponding to the lowest failure cost;

comparing the first total cost and the second total cost; and determining a new setting temperature for air conditioning control which corresponds to smaller one between the first total cost and the second total cost.

10. The air conditioning control method according to claim 9, wherein the failure rate changes in accordance with the setting temperature.

11. The air conditioning control method according to claim 10, wherein the setting temperature corresponding to the lowest failure cost is calculated based on the setting temperature pattern, among the plurality of setting temperature patterns, in which an average of the failure rates which correspond to the setting temperature pattern is smallest.

12. The air conditioning control method according to claim 10, wherein the failure rate of the device is calculated by substituting a setting temperature for air conditioning control in the Arrhenius's equation.

13. The air conditioning control method according to claim 9, wherein each of the electric power cost and the failure cost is calculated under a condition that a temperature of the target place, which is realized by air conditioning control based on the setting temperature, is set such that an average of the temperatures of the target place in a period is an operation temperature that has been determined in advance and a difference between the temperature of the target place and an outside air temperature throughout the period is no more than a threshold value.

14. The air conditioning control method according to claim 9, wherein a plurality of pieces of sensor data are detected by a sensor that detects information related to a setting environment of the device.

15. The air conditioning control method according to claim 9, further comprising transmitting the new setting temperature to a management device of an air conditioner installed in the target place.

16. The air conditioning control method according to claim 15, wherein the management device controls the air conditioner to work in accordance with the new setting temperature.

17. A non-transitory computer-readable medium storing a program that causes a computer to execute a process comprising:

acquiring, for each of sensor data items, a plurality of pieces of sensor data which are detected in a time period;

calculating an average of the plurality of pieces of sensor data;

calculating, based on the average of the plurality of pieces of sensor data, a setting temperature for air conditioning control at which electric power cost corresponding to electric power that is consumed by the air conditioning control is lowest;

storing, in a table, lowest electric power cost and the corresponding setting temperature as a power cost priority item in association with a detection time of the plurality of pieces of sensor data;

creating a plurality of setting temperature patterns based on the average of the plurality of pieces of sensor data for one of the sensor data items and a past setting temperature which is set in past;

calculating, for each of the plurality of setting temperature patterns, a failure rate of a device which is installed in a target place for the air conditioning control;

acquiring a setting temperature of a setting temperature pattern at which a failure cost corresponding to the failure rate is lowest from among the plurality of setting temperature patterns;

storing, in the table, the lowest failure cost and the corresponding setting temperature as a failure cost priority item in association with the detection time of the plurality of pieces of sensor data;

calculating a first total cost by adding the lowest electric power cost to a failure cost corresponding to a failure rate when air conditioning control is performed based on the setting temperature corresponding to the lowest electric power cost;

calculating a second total cost by adding the lowest failure cost to an electric power cost corresponding to electric power when air conditioning control is performed based on the setting temperature corresponding to the lowest failure cost;

comparing the first total cost and the second total cost; and determining a new setting temperature for air conditioning control which corresponds to smaller one between the first total cost and the second total cost.

* * * * *